US012787319B2

(12) United States Patent
Wu et al.

(10) Patent No.: US 12,787,319 B2
(45) Date of Patent: Nov. 3, 2026

(54) SCHOTTKY BARRIER DIODE

(71) Applicant: Taiwan Semiconductor Manufacturing Company, LTD., Hsinchu (TW)

(72) Inventors: Hong-Shyang Wu, Taipei (TW); Kuo-Ming Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 365 days.

(21) Appl. No.: 18/430,955

(22) Filed: Feb. 2, 2024

(65) Prior Publication Data

US 2025/0254899 A1 Aug. 7, 2025

(51) Int. Cl.

| | |
|---|---|
| ***H01L 29/872*** | (2006.01) |
| ***H01L 21/265*** | (2006.01) |
| ***H01L 29/66*** | (2006.01) |
| ***H02M 3/158*** | (2006.01) |
| ***H10D 8/01*** | (2025.01) |
| ***H10D 8/60*** | (2025.01) |
| ***H10P 30/20*** | (2026.01) |

(52) U.S. Cl.
CPC ............... *H10D 8/60* (2025.01); *H10D 8/051* (2025.01); *H10P 30/204* (2026.01); *H10P 30/21* (2026.01)

(58) Field of Classification Search
CPC ......... H10D 62/126; H10D 8/051; H10D 8/60
See application file for complete search history.

(56) References Cited

U.S. PATENT DOCUMENTS 8,704,295 B1 * 4/2014 Darwish ............ H10D 30/0295 257/334
2016/0343881 A1 11/2016 Pang et al.

FOREIGN PATENT DOCUMENTS

CN 105206685 A 12/2015

OTHER PUBLICATIONS

Taiwan Office Action for Application No. 11320963570 Dated: Sep. 23, 2024.

* cited by examiner

*Primary Examiner* — John A Bodnar
(74) *Attorney, Agent, or Firm* — Lippes Mathias LLP

(57) ABSTRACT

A Schottky diode includes an n-type region, an anode disposed on the n-type region, a buried p-type region, and a shallow p-type region. An interface between the anode and the n-type region forms a Schottky barrier. An n-type channel portion of the n-type region is disposed between the buried p-type region and the shallow p-type region. The anode may also contact the annular shallow p-type region. In an annular configuration, the buried p-type region and the shallow p-type region are annular regions, and the n-type region includes a central portion encircled by the annular shallow p-type region and an annular peripheral portion of the n-type region which encircles the annular shallow p-type region. In one application, a buck converter includes the Schottky diode.

20 Claims, 5 Drawing Sheets

Forward bias total current magnitude

Reverse bias impact ionization (log lxl)

SCHOTTKY BARRIER DIODE

BACKGROUND

The following relates to Schottky diodes and to integrated circuit (IC) devices employing same such as buck converters and other types of DC-DC power converters.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
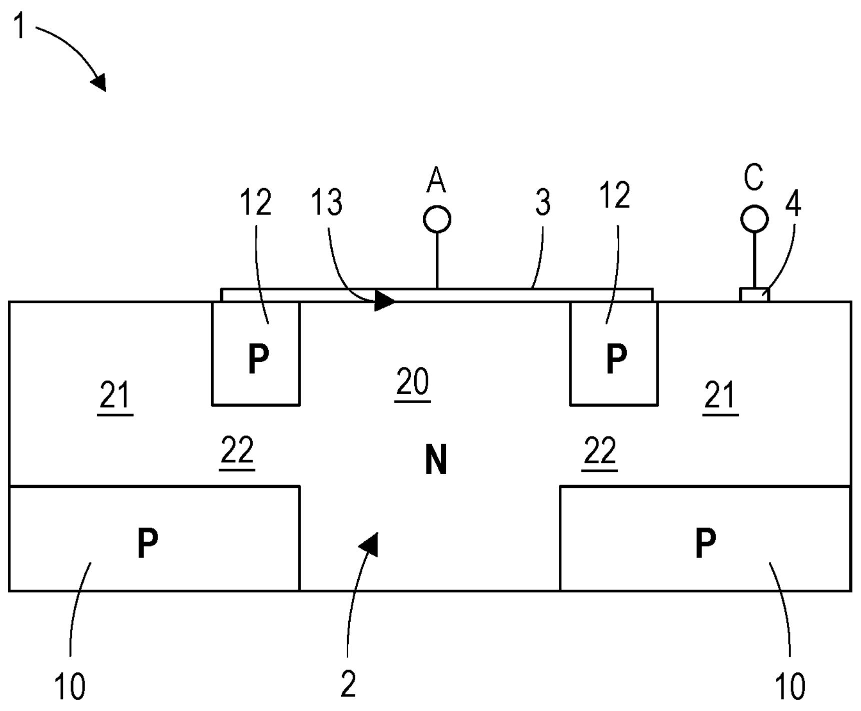
FIG. 1 diagrammatically illustrates a side sectional view of a Schottky barrier diode.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Schottky barrier diode (also sometimes referred to as a Schottky diode, or as a hot-carrier diode) includes a rectifying metal/semiconductor junction. Compared with a rectifying p/n junction, the metal/semiconductor junction of a Schottky barrier diode can provide advantages such as a small forward voltage drop and fast switching speeds. In a nonlimiting illustrative application, a Schottky barrier diode can be included in a buck converter (a type of DC-DC converter). Some typical performance metrics of a Schottky barrier diode include the forward current ($I_{on}$, the electrical current which flows when the Schottky barrier diode is forward biased), the reverse current ($I_{off}$, the electrical current which flows when the Schottky barrier is reverse biased), the ratio $I_{on}/I_{off}$, the resistance in the on state ($R_{on}$, the electrical resistance presented by the Schottky barrier diode when in the forward biased state), and the breakdown voltage (BV). For an application such as a buck converter, it is desirable to have a large value for $I_{on}$, a small value for $I_{off}$, a consequently large value of the ratio $I_{on}/I_{off}$, and a large value for the breakdown voltage.

For a given Schottky barrier diode design, the forward current $I_{on}$ typically increases with increasing area of the metal/semiconductor junction (also referred herein as the Schottky barrier diode area, or SBD area). A large Schottky barrier diode area also reduces the forward bias resistance $R_{on}$. Hence, a large Schottky barrier diode area is desirable for high current applications. On the other hand, to increase the breakdown voltage, the semiconductor underneath the metal/semiconductor junction can have interspersed regions of opposite doping polarity (e.g., if the metal/semiconductor junction is a metal/n-type semiconductor junction then interspersed regions of p-type doping can be provided). In the reversed-biased state, these regions of opposite doping type are operative to laterally pinch off the reverse current and thereby improve (i.e., increase) the breakdown voltage. However, these regions of opposite doping type reduce the effective Schottky barrier diode area, thus reducing the forward current $I_{on}$ and increasing the forward bias resistance $R_{on}$.

Such design challenges are further increased when fabricating a high current Schottky barrier diode as a component of an integrated circuit (IC). For example, a buck converter or other DC-DC converter may be fabricated as an IC (or part of an IC), including a Shottky barrier diode as a component of the buck converter. Typically, a goal of IC design is miniaturization of the electronic components, including the Schottky barrier diode(s). This drive toward miniaturization can be achieved by reducing the Schottky barrier diode area, but as previously noted reducing the Schottky barrier area typically comes at the cost of reducing the forward current $I_{on}$ and increasing the forward bias resistance $R_{on}$.

Embodiments of Schottky barrier diodes disclosed herein advantageously overcome these disadvantages and others. Embodiments of Schottky barrier diodes disclosed herein simultaneously achieve a small (or reduced) Schottky barrier diode area while providing (or maintaining) a high value for the forward current $I_{on}$ and low value for the forward bias resistance $R_{on}$, while additionally maintaining a high breakdown voltage. In some nonlimiting illustrative embodiments, a vertical depleted region is formed between a deep p-well (DPW) and an n-type channel region to provide a conductive channel for conducting the forward current $I_{on}$ in the forward bias state, as well as providing pinch-off of the electrical current in the reverse bias state to maintain high breakdown voltage. Thus, the disclosed Schottky barrier diodes provide improved (i.e., high) forward current $I_{on}$ and improved (i.e., low) forward resistance $R_{on}$ without sacrificing the breakdown voltage performance of the Schottky barrier diode. Embodiments of Schottky barrier diodes disclosed herein are also advantageously compatible with standard bipolar-CMOS-DMOS (BCD) fabrication workflows, and can typically be implemented without adding any additional ion implantation or mask steps in the BCD workflow.

With reference to FIG. 1, a side sectional view is diagrammatically shown of a Schottky barrier diode 1. The illustrative Schottky barrier diode 1 includes an n-type region 2, an anode 3 disposed on the n-type region 2, a cathode 4 disposed on the n-type region 2 (and a diagrammatically indicated cathode connection C), a buried p-type region 10, and a shallow p-type region 12. FIG. 1 also diagrammatically illustrates an anode connection A to the anode 3, and a diagrammatically indicated cathode connection C to the cathode 4. An interface 13 between the anode 3 and the n-type region 2 forms or comprises a Schottky barrier. In some nonlimiting illustrative embodiments, the n-type region 2 is n-type silicon and the anode 3 is a silicide layer, such as a cobalt disilicide ($CoSi_2$) or NiSi (a type of nickel silicide) which provide a Schottky barrier height of around 0.6-0.7 eV. In other embodiments, other silicide are contemplated for the anode 3, such as erbium disilicide ($ErSi_{2-x}$), titanium disilicide ($TiSi_2$), platinum silicide (PtSi), iridium silicide (IrSi), or so forth. Depending on the choice of silicide, the Schottky barrier height of the Schottky barrier 13 can be designed over a wide range (e.g., about 0.25-0.95 eV for the foregoing nonlimiting illustrative silicide examples). In yet other embodiments, it is contemplated for the anode to be a metal or metal alloy layer such as molybdenum, platinum, chromium, tungsten, or so forth. The buried p-type region 10 is in some embodiments p-type silicon, and the shallow p-type region 12 is in some embodiments p-type silicon. As seen in FIG. 1, the n-type region 2 includes a central portion 20 of the n-type region 2, a peripheral portion 21 of the n-type region 2, and an n-type channel portion 22 of the n-type region 2. The n-type channel portion 22 is disposed between the buried p-type region 10 and the shallow p-type region 12, and the n-type channel portion 22 of the n-type region 2 connects the central portion 20 of the n-type region 2 and the peripheral portion 21 of the n-type region 2 to provide a conductive path in the forward bias state between the anode 3 which is disposed on the central portion 20 of the n-type region 2, and the cathode 4 which is disposed on the peripheral portion 21 of the n-type region 20. Hence, electrical current flowing between the anode 3 and the cathode 4 flows through the n-type channel portion 22 of the n-type region 2.

The n-type channel portion 22 of the n-type region 2 enables the advantages of the disclosed Schottky barrier diodes previously referred to. In forward bias, the n-type channel portion 22 of the n-type region 2 provides a high conductance path for forward current flow, thus enabling high forward current $I_{on}$ and low forward resistance $R_{on}$. On the other hand, in reverse bias a depletion region forms between the n-type channel portion 22 of the n-type region 2 and the sandwiching buried p-type region 10 and the shallow p-type region 12 which serves to pinch off the reverse current, thereby maintaining a low reverse current ($I_{off}$) and hence a high $I_{on}/I_{off}$ ratio, and also maintains the desirable high breakdown voltage. Thus, the n-type channel portion 22 of the n-type region 2 is configured to conduct electrical current between the anode 3 and the cathode 4 when the Schottky diode 1 is forward biased, and to pinch off electrical current between the anode 3 and the cathode 4 when the Schottky diode 1 is reverse biased. The pinch-off of the electrical current under reverse bias is a vertical pinch-off of the n-type channel portion 22 of the n-type region 2 by the sandwiching buried p-type region 10 and the shallow p-type region 12.

In some embodiments, the anode 3 also contacts the shallow p-type region 12, as shown in FIG. 1. In such embodiments, a p/n junction between the shallow p-type region 12 and the n-type channel portion 22 is forward biased when the Schottky barrier diode 1 is forward biased. This forward-biased p/n junction further enhances the forward current, thus advantageously enhancing the forward current $I_{on}$ and reducing the forward resistance $R_{on}$. Conversely, when the Schottky barrier diode 1 is reversed biased this also applies a reverse bias to the p/n junction extant between the shallow p-type region 12 and the n-type channel portion 22. This further enhances the pinch-off of the electrical current during reverse bias, thus reducing $I_{off}$ and increasing the ratio $I_{on}/I_{off}$ and facilitating maintaining a large breakdown voltage.

In some embodiments, the Shottky barrier diode 1 has an annular layout. In this annular layout, the buried p-type region 10 is an annular buried p-type region disposed in a lower portion of the n-type region 2. The shallow p-type region 12 is likewise an annular shallow p-type region disposed in an upper portion of the n-type region 2. The n-type channel portion 22 of the n-type region 2 is an annular n-type channel portion 22 disposed between the annular buried p-type region 10 and the annular shallow p-type region 12.

In some embodiments, the Schottky diode 1 is fabricated in a p-type substrate. In such embodiments, the n-type region 2, the buried p-type region 10, and the shallow p-type region 12 are each implanted regions formed in the p-type substrate by ion implantation and comprising respective dopant profiles produced by the ion implantation. The dopant profile of each region is controlled by ion implantation parameters such as ion species, ion energy (e.g., higher energy providing deeper implantation), energy distribution of the ion beam, implantation dose (e.g., measured in atoms per cubic centimeter, i.e., atoms/$cm^2$), and/or so forth. Furthermore, some regions may optionally be formed by two (or more) ion implantations. For example, the n-type region 2 may be formed in two implantations: one ion implantation to form the central portion 20 of the n-type region 2, and another ion implantation to from the peripheral portion 21 of the n-type region 2 and the n-type channel portion 22 of the n-type region 2. By this approach, for example, in some embodiments the central portion 20 may have a higher doping level than the peripheral and channel portions 21 and 22.

Figure 2:
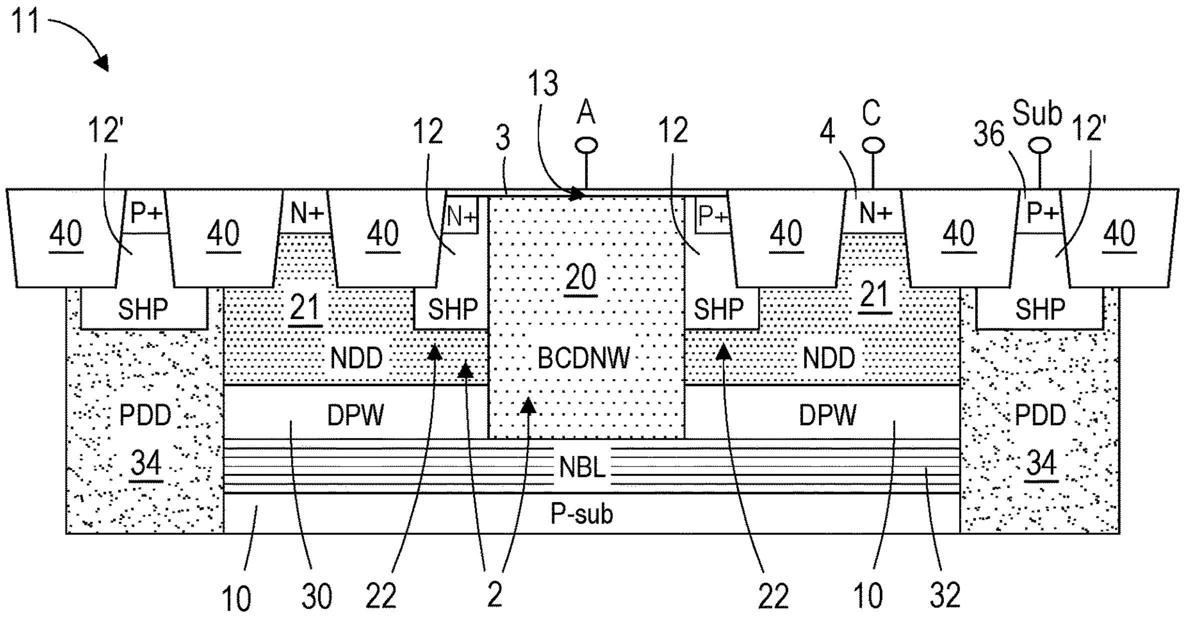
FIGS. 2 and 3 diagrammatically illustrate a side sectional view (FIG. 2) and a top view (FIG. 3) of a Schottky barrier diode, where the side sectional view of FIG. 2 is taken along section line S-S indicated in FIG. 3.
Figure 3:
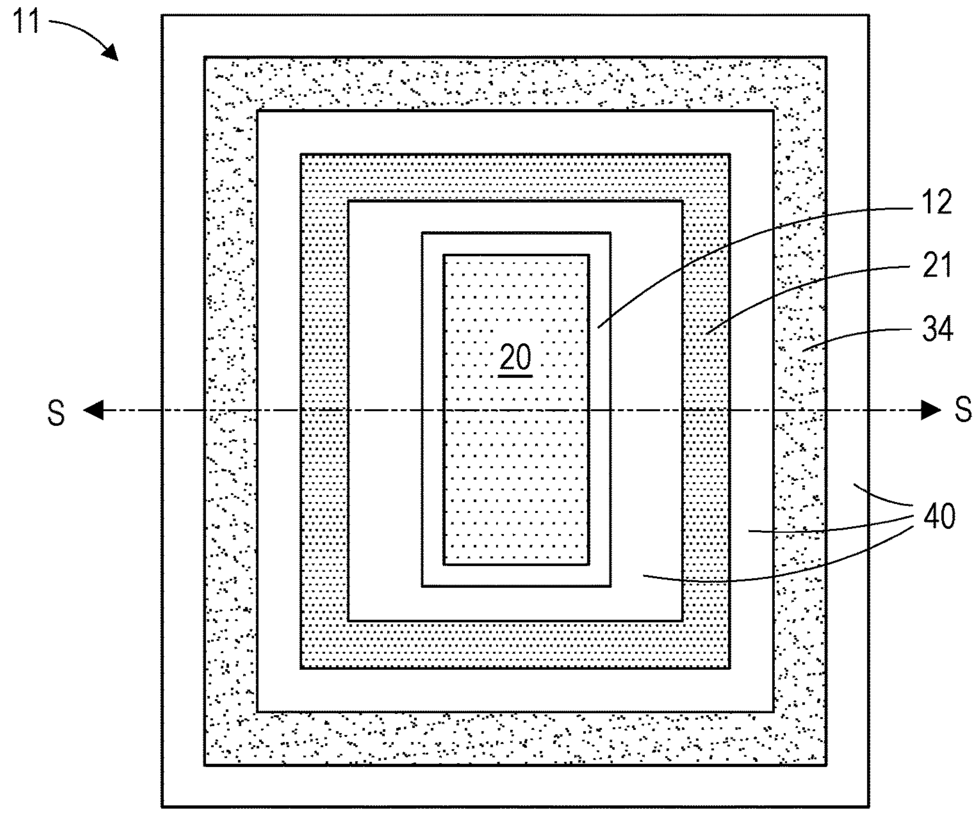

With reference to FIGS. 2 and 3, a side sectional view (FIG. 2) and a top view (FIG. 3) are diagrammatically shown of a Schottky barrier diode 11. The side sectional view of FIG. 2 is taken along section line S-S indicated in FIG. 3. The Schottky barrier diode 11 of FIGS. 2 and 3 is advantageously compatible with standard bipolar-CMOS-DMOS (BCD) fabrication workflows, and can typically be implemented without adding any additional ion implantation or mask steps in the BCD workflow. Structurally, the Schottky barrier diode 11 of FIGS. 2 and 3 is similar to the Schottky barrier diode 1 of FIG. 1, an includes the n-type region 2, the anode 3 disposed on the n-type region 2 (and a diagrammatically indicated anode connection A), the cathode 4 disposed on the n-type region 2 (and a diagrammatically indicated cathode connection C), the buried p-type region 10, and the shallow p-type region 12. As in the embodiment of FIG. 1, the interface 13 between the anode 3 and the n-type region 2 forms or comprises a Schottky barrier. In some nonlimiting illustrative embodiments, the n-type region 2 is n-type silicon and the anode 3 is a silicide layer, such as $CoSi_2$, NiSi, $ErSi_{2-x}$, $TiSi_2$, PtSi, IrSi, or so forth; or a metal or metal alloy layer such as molybdenum, platinum, chromium, tungsten, or so forth. In the embodiment of FIGS. 2 and 3, the cathode 4 comprises an $n^+$ region.

but includes some additional regions, and more particularly specifies an embodiment of the n-type region 2 of the Schottky barrier diode 1 of FIG. 1. In the example of FIGS. 2 and 3, the central portion 20 if the n-type region 2 is formed by a different ion implantation than the ion implantation which forms the peripheral and channel portions 21 and 22 of the n-type region 2. In the BCD fabrication workflow, the Schottky barrier diode 11 is fabricated on a p-type silicon substrate 30 (a lower portion of which is indicated in FIG. 2), and the Schottky barrier diode 11 also includes (or viewed alternatively, is formed within) a containment structure formed in the p-type substrate. The containment structure includes an n-type buried layer (NBL) 32 suitably formed by ion implantation into the p-type substrate, and an annular p-type region (PDD) 34 encircling the annular buried p-type region 10. The n-type buried layer 32 is in contact with n-type buried layer 2 (and, more particularly, is in contact with the central portion 20 of the n-type region 2) to avoid having the n-type buried layer 2 electrically floating. Similarly, the annular p-type region 34 functions as a guard ring, and is in contact with the buried p-type region 10 to avoid having the annular p-type region 34 electrically floating. The p-type region 34 is optionally connected to a substrate terminal Sub by a substrate contact 36 implemented as a $p^+$ region. Note that the buried p-type region 10 may also be referred to herein as a deep p-well (DPW) 10, the shallow p-type region 12 may be referred to as a shallow p-well (SPW) 12, the combination of the peripheral n-type channel portions 21 and 22 of the n-type region 2 may also be referred to as an n-type double-diffused (NDD) region, and the central portion 20 of the n-type region 20 may be referred to as a BCD n-type well (BCDNW) 20.

In a nonlimiting fabrication process compatible with BCD fabrication workflows, the annular p-type region 34 may be formed by an ion implantation, the buried n-type layer 32 may be formed by ion implantation, the buried p-type region 10 may be formed by ion implantation, the central portion 20 of the n-type region 2 may be formed by a first ion implantation while the peripheral n-type channel portions 21 and 22 of the n-type region 2 may be formed by a second ion implantation, and the shallow p-type region 12 may be formed by ion implantation. In some embodiments, double-diffusion or counter doping may be employed for certain regions. For example, in one contemplated workflow the buried p-type region 10 may be formed by p-type ion implantation, followed by forming the peripheral and channel portions 21 and 22 of the n-type region 2 by double-diffusion or counter-doping by way of an n-type ion implantation, followed by counter-doping the shallow p-type region 12 using p-type ion implantation. In some embodiments, the ion implantation that forms the shallow p-type region 12 may optionally also form a shallow p-type region 12' in the annular p-type region 34. This optional shallow p-type region 12' can improve the connection of the substrate contact 36 to the annular p-type region 34 (e.g., if the p-type doping level of the shallow p-type region 12' is higher than that of the annular p-type region 34), and does not increase processing complexity (e.g., does not add an additional ion implantation or mask step). These are merely nonlimiting illustrative examples, and numerous other workflows are contemplated. It is likewise contemplated to employ dopant diffusion in place of ion implantation for forming one or more of these doped regions.

In some nonlimiting illustrative embodiments, the central portion 20 of the n-type region 2 may have a vertical height of around 2.7 micron to 3.0 micron, the buried p-type region 10 may have a vertical height of around 1.2 micron, and the vertical height of the n-type channel portion 22 located between the buried p-type region 10 and the shallow p-type region 12 (which may also be called a pinch-off height) is around 0.4 micron. Again, these are merely nonlimiting illustrative ranges suitable for some silicon Schottky diode designs.

In some nonlimiting illustrative examples, the following ion implantation dosages are used in forming the Schottky barrier diode 11 of FIGS. 2 and 3. The central portion 20 of the n-type region 2 is doped n-type with an ion implantation dosage of between $1.5\times10^{12}$ atoms/$cm^2$ and $1\times10^{13}$ atoms/$cm^2$. The peripheral and channel regions 21 and 22 of the n-type region 2 is doped n-type with an ion implantation dosage of between $1\times10^{12}$ atoms/$cm^2$ and $5\times10^{12}$ atoms/$cm^2$. The buried p-type region 10 is doped p-type with an ion implantation dosage of between $5\times10^{12}$ atoms/$cm^2$ and $2\times10^{13}$ atoms/$cm^2$. The shallow p-type region 12 (and optional corresponding region 12') is doped p-type with an ion implantation dosage of between $5\times10^{12}$ atoms/$cm^2$ and $1\times10^{13}$ atoms/$cm^2$. The annular p-type region 34 is doped p-type with an ion implantation dosage of between $1\times10^{12}$ atoms/$cm^2$ and $5\times10^{12}$ atoms/$cm^2$. The buried n-type layer 32 is doped n-type with an ion implantation dosage of about $1\times10^{14}$ atoms/$cm^2$. Yet again, these are merely nonlimiting illustrative ranges suitable for some silicon Schottky diode designs.

With continuing reference to FIGS. 2 and 3, the illustrative Schottky barrier diode 11 further includes shallow trench isolation (STI) regions 40 providing electrical isolation between the anode 3 and cathode 4, and between the cathode 4 and the annular p-type region (PDD) 34. The STI regions 40 are suitably silicon dioxide, though other dielectric materials are contemplated for the STI regions 40. With particular reference to FIG. 3, as seen in the top view there shown the Schottky barrier diode 11 has an annular layout, in which the buried p-type region 10 is an annular buried p-type region disposed in a lower portion of the n-type region 2, the shallow p-type region 12 is an annular shallow p-type region disposed in an upper portion of the n-type region 2, and the n-type channel portion 22 of the n-type region 2 is an annular n-type channel portion 22 disposed between the annular buried p-type region 10 and the annular shallow p-type region 12. In the example of FIG. 3, these annular regions have rectangular outer and inner perimeters, but other shapes (circular, oval, square, hexagonal, et cetera) are alternatively contemplated.

Said in another way, the Schottky diode 11 includes the n-type region 2, the anode 3 disposed on the n-type region 2, the buried p-type region 10, and the shallow p-type region 12. The interface 13 between the anode 3 and the n-type region 2 forms a Schottky barrier. An n-type channel portion 22 of the n-type region 2 is disposed between the buried p-type region 10 and the shallow p-type region 12. In some embodiments, the anode 3 also contacts the annular shallow p-type region 12. In some such embodiments, the buried p-type region 10 is an annular buried p-type region disposed in a lower portion of the n-type region 2, the shallow p-type region 12 is an annular shallow p-type region disposed in an upper portion of the n-type region 2, and the n-type channel portion 22 of the n-type region 2 connects a central portion 20 of the n-type region 2 and an annular peripheral portion 21 of the n-type region 2. In this annular configuration, the central portion 20 is encircled by the annular shallow p-type region 12, and the annular peripheral portion 21 of the n-type region 2 encircles the annular shallow p-type region 12.

As in the Schottky barrier diode 1 of FIG. 1, the Schottky barrier diode 11 of FIGS. 2 and 3 is in some embodiments a silicon device, in which the n-type regions 2 (including the central, peripheral, and channel portions 20, 21, and 22) and 32 are n-type silicon, the p-type regions 10, 12, and 34 are p-type silicon, and the substrate 30 is p-type silicon. However, it is contemplated for the Schottky barrier diode 11 to be fabricated in other material systems, such as silicon carbide.

Figure 4:
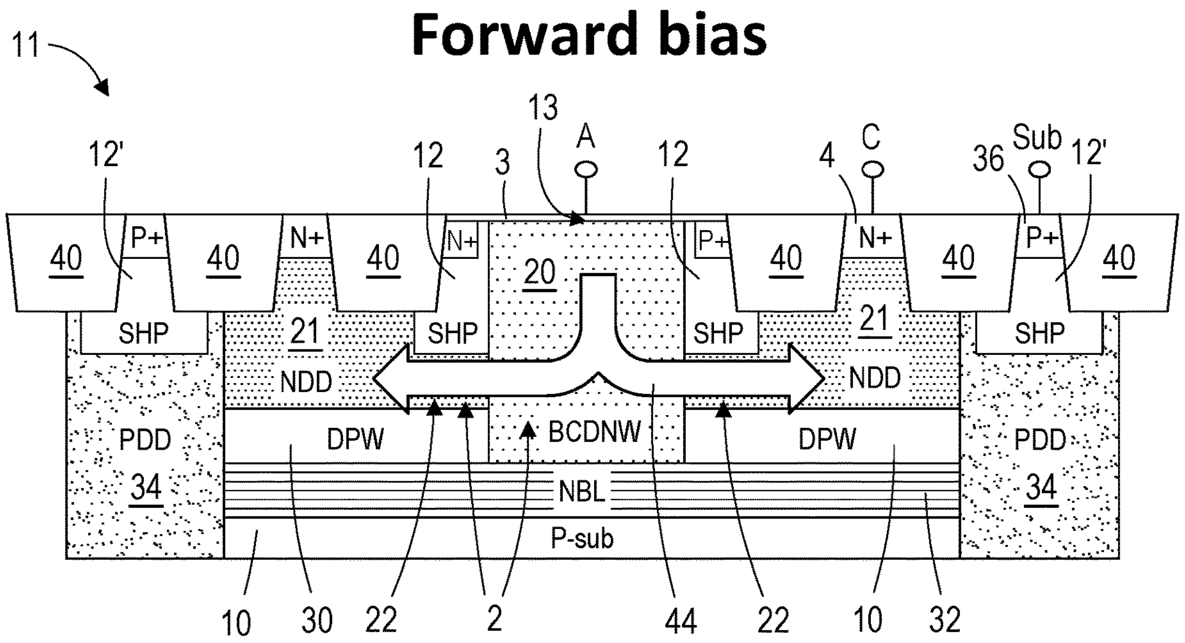
FIG. 4 diagrammatically illustrates a side sectional view of the Schottky barrier diode of FIGS. 2 and 3 under forward bias.

With reference to FIG. 4, operation of the Schottky barrier diode 11 of FIGS. 2 and 3 is diagrammatically shown in forward bias. In the forward bias state, forward current 44 flows from the anode 3, through the central portion 20 of the n-type region 2, through the n-type channel 22 and into the peripheral region 21 to reach the cathode 4. In the forward biased state, the n-type channel 22 provides a low resistance path for the forward electrical current 44, thus providing a high forward current $I_{on}$ and low forward resistance $R_{on}$. In some embodiments, such as the illustrative example, the illustrative anode 3 is also disposed over and electrically contacts the shallow p-type doping region 12, thus forming a forward-biased p/n junction between the shallow p-type doping region 12 and the n-type channel region 22 during forward biasing of the Schottky diode 11. This forward-biased p/n junction further enhances the forward current $I_{on}$ and reduces the forward resistance $R_{on}$.

Figure 5:
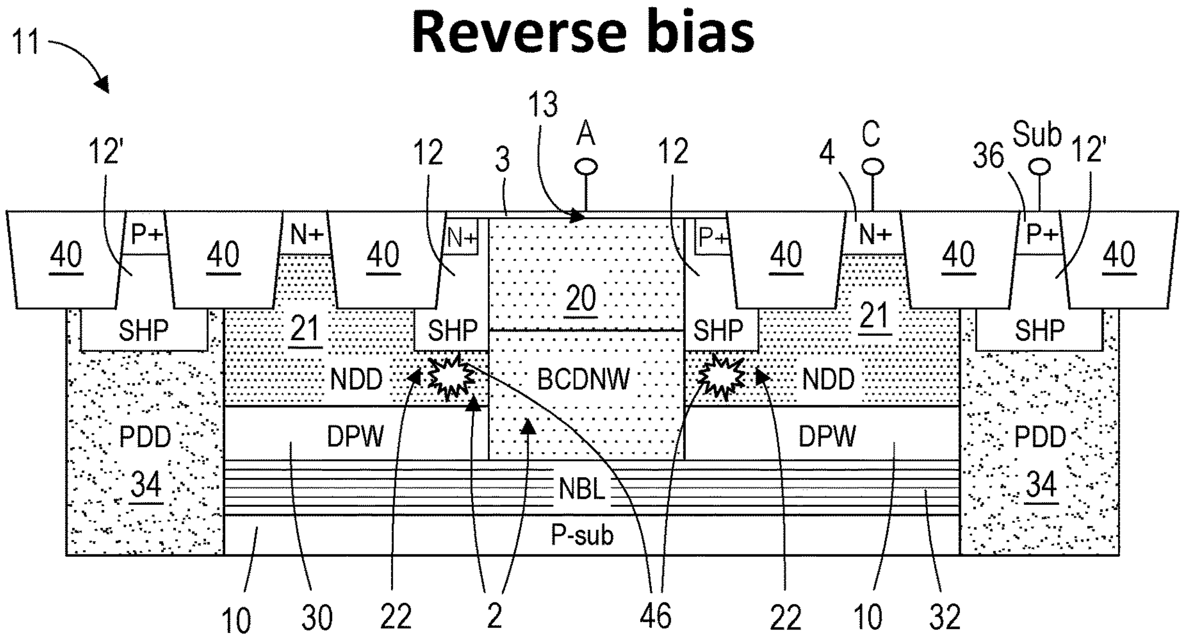
FIG. 5 diagrammatically illustrates a side sectional view of the Schottky barrier diode of FIGS. 2 and 3 under reverse bias.

With reference to FIG. 5, operation of the Schottky barrier diode 11 of FIGS. 2 and 3 is diagrammatically shown in reverse bias. In the reverse bias state, the channel portion 22 of the n-type region 2 is pinched off (as diagrammatically indicated in FIG. 5 by blockage 46), thus suppressing the reverse bias electrical current $I_{off}$ and maintaining a high breakdown voltage (BV). In some embodiments, such as the illustrative example, the illustrative anode 3 also covers and electrically contacts the shallow p-type doping region 12, thus forming a reverse-biased p/n junction between the shallow p-type doping region 12 and the n-type channel region 22 during reverse biasing of the Schottky diode 11. This reverse-biased p/n junction further enhances the pinch-off of the electrical current during reverse bias, thus reducing $I_{off}$ and increasing the ratio $I_{on}/I_{off}$ and facilitating maintaining a large breakdown voltage.

Figure 6:
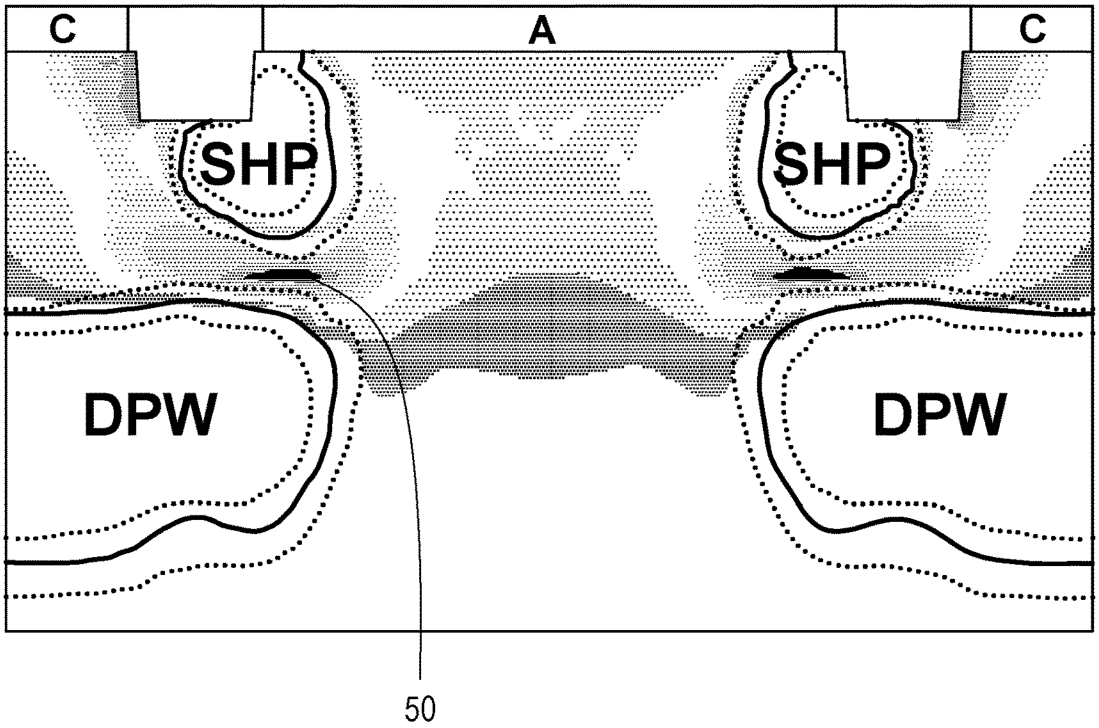
FIG. 6 diagrammatically illustrates simulation of forward bias total current magnitude for the Schottky barrier diode of FIGS. 2 and 3.
Figure 7:
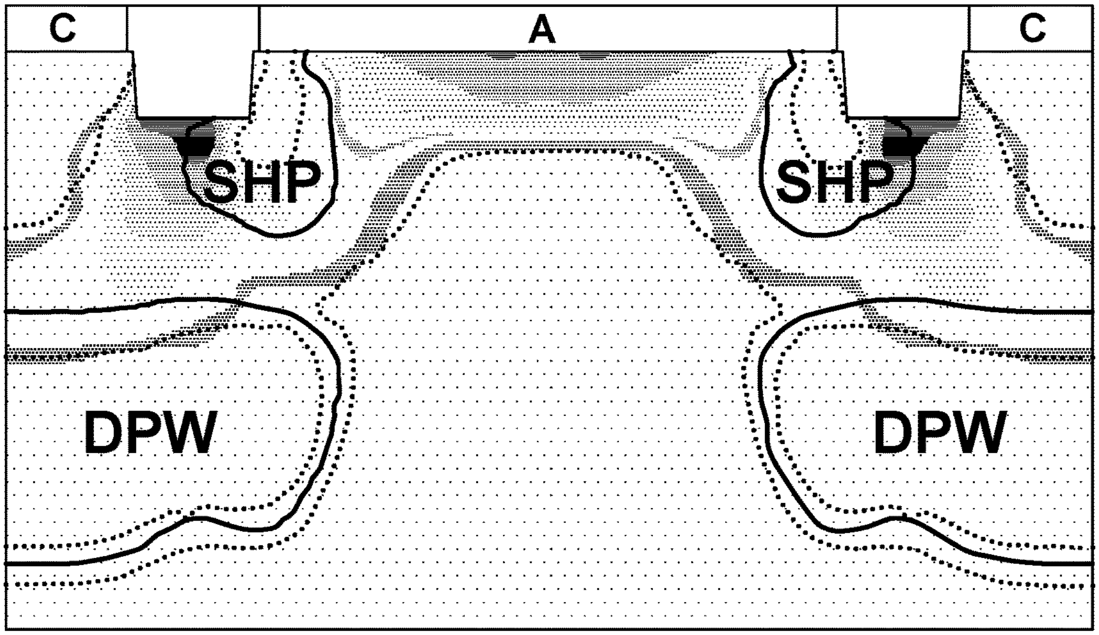
FIG. 7 diagrammatically illustrates simulation of reverse bias impact ionization for the Schottky barrier diode of FIGS. 2 and 3.

With reference now to FIGS. 6 and 7, technology computer-aided design (TCAD) simulations of the Schottky barrier diode 11 described with reference to FIGS. 2-5 are shown. FIGS. 6 and 7 show TCAD simulation by way of side sectional views taken along the section line S-S indicated in FIG. 3. In FIGS. 6 and 7: the buried p-type layer 10 is indicated by the acronym "DPW"; the shallow p-type layer 12 is indicated by the acronym "SHP"; the anode 3 is labeled by the letter "A", and the cathode 4 is labeled by the letter "C". As previously explained, the n-type channel portion 22 of the n-type region 2 lies between the buried p-type layer (DPW) 10 and the shallow p-type layer (SHP) 12.

FIG. 6 shows a TCAD simulated map of total current density magnitude during forward bias of the Schottky barrier diode 11. As seen in FIG. 6, a high peak current density 50 of around $5\times10^4$ A-cm$^{-2}$ to $6\times10^4$ A-cm$^{-2}$ is observed flowing through the n-type channel portion 22 of the n-type region 2. Referring back to the top view of FIG. 3, it will be appreciated that this high peak current density is present in an annular region of the Schottky barrier diode 11 corresponding to the annular area of the shallow p-type layer 12 indicated in FIG. 3. Still further, the Schottky barrier diode area corresponds to the lateral area of the central portion 20 of the n-type region 2. This area is completely open (that is, no STI regions are located in this area) and so the maximum Schottky barrier diode area is achieved for a given lateral area of the central portion 20 of the n-type region 2. Hence, a high total forward current $I_{on}$ is expected to be achieved based on the TCAD simulation of FIG. 6.

FIG. 7 shows a TCAD simulated map of impact ionization (log I×I) during reverse bias of the Schottky barrier diode 11. As seen in FIG. 7, the n-type channel portion 22 of the n-type region 2 is effectively pinched off during reverse bias. The contribution of the p/n junction at the interface between the shallow p-type region (SHP) 12 and the n-type channel portion 22 is also apparent. Hence, a low reverse current $I_{off}$ and high breakdown voltage is expected to be achieved based on the TCAD simulation of FIG. 7.

Experimental measurements of forward bias and reverse bias current-voltage (I-V) curves were performed for a Schottky barrier diode fabricated in accordance with the illustrative embodiment of FIGS. 2 and 3. A high value of $I_{on}$=2.16 microamperes/micron and a low value of $R_{on}$=0.021 ohm-mm$^2$ was observed at 0.45 volts forward bias, confirming the advantageously high current performance. For reverse bias, a low reverse current $I_{off}=8.00\times10^{-14}$ amperes/micron was observed at a reverse bias of 10 volts, and a high breakdown voltage of BV=26.2 volts was observed, confirming the advantageously low reverse bias leakage current and high breakdown voltage. The corresponding ratio $I_{on}/I_{off}=2.7\times10^7$.

The Schottky barrier diode embodiments disclosed herein are suitable for fabrication as components of an integrated circuit (IC), for example as Schottky diodes in standard bipolar-CMOS-DMOS (BCD) fabrication workflows.

Figure 8:
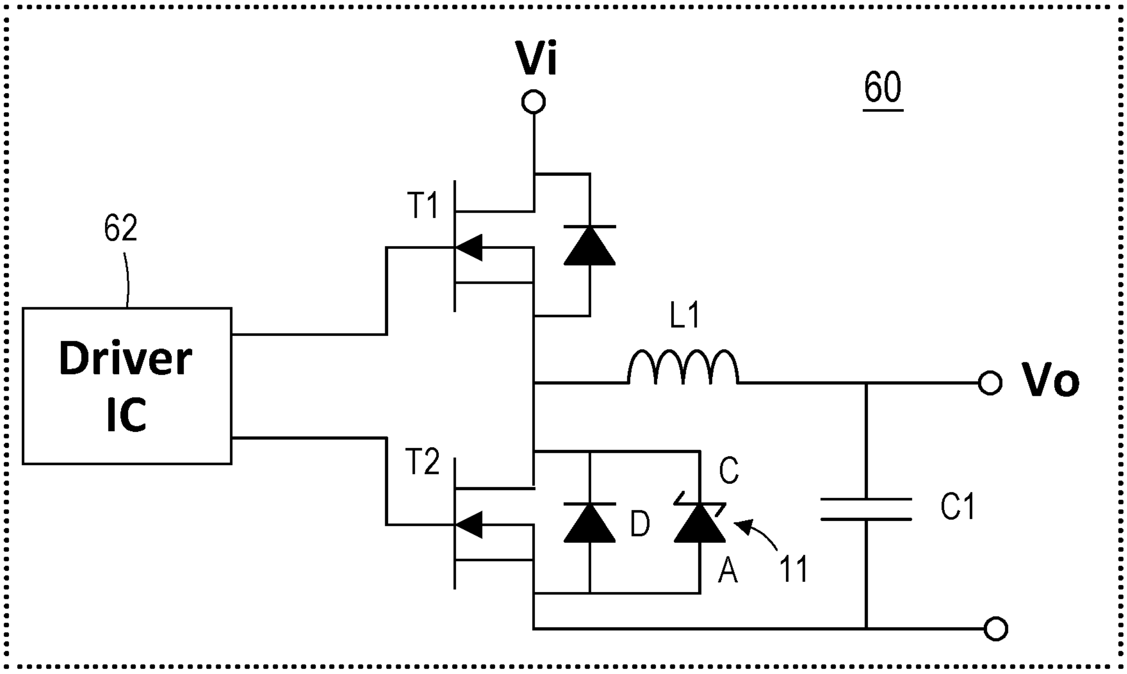
FIG. 8 shows a circuit schematic of a buck converter employing a Schottky diode as described herein.

With reference to FIG. 8, in a nonlimiting illustrative example the illustrative Schottky barrier diode 11 is included in a buck converter 60. A buck converter (also known as a step-down converter) is a type of switching DC-DC converter that converts an input voltage Vi to a lower voltage, higher current signal at output voltage Vo. Use of the Schottky barrier diode 11 in a buck converter can reduce switching losses due to dead time during recovery from the reverse biased state. The illustrative buck converter of FIG. 8 includes an n-type metal-oxide-semiconductor (NMOS) transistor T1, an NMOS transistor T2, and an LC circuit including an inductor L1 and a capacitor C1 connected in series across the channel of the NMOS transistor T2. The Schottky barrier diode 11 is also connected across the channel of the NMOS transistor T2, and a p/n junction diode D is optionally connected in parallel with the Schottky barrier diode 11 (and hence is also connected across the channel of the NMOS transistor T2). The body terminal of each NMOS transistor T1 and T2 is connected to its source terminal. The input voltage Vi is applied to the drain terminal of the NMOS transistor T1, and the output voltage Vo is delivered at the node connecting the inductor L1 and the capacitor C1 in series. A driver IC 62 applies a drive signal to the bases of the NMOS transistors T1 and T2.

Advantageously, the buck converter 60 of FIG. 8 can be fabricated as an integrated circuit, for example in BCD technology.

A buck converter was constructed in accord with the circuit of FIG. 8. Experimental efficiency versus input power was measured as a function of power. The efficiency exceeded 90% for tested input powers of 100 watts or higher, and reached about 95% at the highest tested input power of about 270 watts.

In the following, some further embodiments are described.

In a nonlimiting illustrative embodiment, a method of fabricating a Schottky diode is disclosed. The method comprises: forming an n-type region in a p-type substrate by ion implantation; forming an annular buried p-type region in the n-type region by ion implantation; forming an annular shallow p-type region in the n-type region by ion implantation at a shallower depth than the annular buried p-type region, wherein an annular n-type channel portion of the n-type region is disposed between the annular buried p-type region and the annular shallow p-type region; and forming an anode of the Schottky diode on a central portion of the n-type region, wherein an interface between the anode and the central portion of the n-type region comprises a Schottky barrier.

In a nonlimiting illustrative embodiment, a Schottky diode comprises: an n-type region; an anode of the Schottky diode disposed on the n-type region, an interface between the anode and the n-type region comprising a Schottky barrier; a buried p-type region; and a shallow p-type region. An n-type channel portion of the n-type region is disposed between the buried p-type region and the shallow p-type region.

In a nonlimiting illustrative embodiment, a buck converter comprises an LC circuit including an inductor, a capacitor, a transistor, and at least one diode connected across a channel of the transistor. The at least one diode includes a Schottky diode including an n-type region, an anode of the Schottky diode disposed on the n-type region in which an interface between the anode and the n-type region comprises a Schottky barrier, a buried p-type region, and a shallow p-type region. An n-type channel portion of the n-type region is disposed between the buried p-type region and the shallow p-type region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a Schottky diode, the method comprising:

forming an n-type region in a p-type substrate by ion implantation;

forming an annular buried p-type region in the n-type region by ion implantation;

forming an annular shallow p-type region in the n-type region by ion implantation at a shallower depth than the annular buried p-type region, wherein an annular n-type channel portion of the n-type region is disposed between the annular buried p-type region and the annular shallow p-type region; and forming an anode of the Schottky diode on a central portion of the n-type region, wherein an interface between the anode and the central portion of the n-type region comprises a Schottky barrier.

2. The method of claim 1, wherein:

the n-type region further includes an annular peripheral portion encircling the annular shallow p-type region, and the annular n-type channel portion of the n-type region connects the central portion of the n-type region and the annular peripheral portion of the n-type region, and the method further comprises forming a cathode of the Schottky diode electrically contacting the annular peripheral portion of the n-type region.

3. The method of claim 2, wherein the anode also contacts the annular shallow p-type region.

4. The method of claim 2, wherein the forming of the n-type region includes:

forming the central portion of the n-type region by a first ion implantation; and forming a remainder of the n-type region including the annular n-type channel portion and the annular peripheral portion by a second ion implantation.

5. The method of claim 4, further comprising:

forming an n-type buried layer by ion implantation at a depth deeper than the n-type region, wherein the n-type region contacts the n-type buried layer.

6. The method of claim 5, further comprising:

forming an annular p-type region by ion implantation which encircles the annular buried p-type region and which contacts the annular buried p-type region.

7. The method of claim 1, wherein the forming of the anode of the Schottky diode on the central portion of the n-type region includes:

forming the anode comprising a silicide layer on the central portion of the n-type region.

8. A method of fabricating a Schottky diode, the method comprising:

forming an n-type region in a p-type substrate;

forming a first annular p-type region in the n-type region;

forming a second annular p-type region in the n-type region at a shallower depth than the first annular p-type region, wherein an annular n-type channel portion of the n-type region is disposed between the first annular p-type region and the second annular p-type region; and forming an anode of the Schottky diode disposed on the n-type region, an interface between the anode and the n-type region comprising a Schottky barrier.

9. The method of claim 8, wherein the anode also contacts the second annular p-type region.

10. The method of claim 8, further comprising:

forming a cathode of the Schottky diode electrically contacting the n-type region;

wherein the n-type channel portion of the n-type region is configured to conduct electrical current between the anode and the cathode when the Schottky diode is forward biased, and to pinch off electrical current between the anode and the cathode when the Schottky diode is reverse biased.

11. The method of claim 8, wherein:

the first annular p-type region is disposed in a lower portion of the n-type region;

the second annular p-type region is disposed in an upper portion of the n-type region; and the n-type channel portion of the n-type region connects a central portion of the n-type region and an annular peripheral portion of the n-type region, wherein the central portion is encircled by the second annular p-type region and the annular peripheral portion of the n-type region encircles the second annular p-type region.

12. The method of claim 11, further comprising:

forming a cathode of the Schottky diode electrically contacting the annular peripheral portion of the n-type region.

13. The method of claim 11, further comprising:

forming an n-type buried layer that is disposed beneath the n-type region and beneath the first annular p-type region, the n-type region being in contact with n-type buried layer; and forming a third annular p-type region encircling the first annular p-type region and in contact with the first annular p-type region.

14. The method of claim 8, wherein:

the first annular p-type region and the second annular p-type region are each formed in the p-type substrate by ion implantation.

15. The method of claim 8, wherein the forming of the anode of the Schottky diode comprises disposing a silicide layer on the n-type region.

16. A method of forming a buck converter, the method comprising:

forming a Schottky diode by operations including:

forming an n-type region in a p-type substrate by ion implantation;

forming an annular buried p-type region in the n-type region by ion implantation;

forming an annular shallow p-type region in the n-type region by ion implantation at a shallower depth than the annular buried p-type region, wherein an annular n-type channel portion of the n-type region is disposed between the annular buried p-type region and the annular shallow p-type region; and forming an anode of the Schottky diode on a central portion of the n-type region, wherein an interface between the anode and the central portion of the n-type region comprises a Schottky barrier;

forming an LC circuit including an inductor, a capacitor, a transistor, and the Schottky diode connected across a channel of the transistor.

17. The method of claim 16, wherein:

the buried p-type region of the Schottky diode is an annular buried p-type region disposed in a lower portion of the n-type region;

the shallow p-type region of the Schottky diode is an annular shallow p-type region disposed in an upper portion of the n-type region;

the n-type channel portion of the n-type region of the Schottky diode is disposed between the annular buried p-type region and the annular shallow p-type region; and the operations forming the Schottky diode further includes forming a cathode of the Schottky diode electrically contacting the annular peripheral portion of the n-type region.

18. The method of claim 17, wherein the operations forming the Schottky diode further include:

forming an n-type buried layer disposed beneath the n-type region and beneath the annular buried p-type region, the n-type region being in contact with n-type buried layer; and forming an annular p-type region encircling the annular buried p-type region and in contact with the annular buried p-type region.

19. The method of claim 17, further comprising:

connecting a p/n junction diode in parallel with the Schottky diode.

20. The method of claim 16, wherein the buck converter is formed as an integrated circuit (IC).

* * * * *